US012681069B2

(12) United States Patent
Pfeilschifter et al.

(10) Patent No.: US 12,681,069 B2
(45) Date of Patent: Jul. 14, 2026

(54) SENSING SYMMETRICAL AND ASYMMETRICAL INSULATION FAULTS BY THE ASYMMETRICALLY SWITCHABLE SENSING OF FAULT CURRENT

(71) Applicant: Vitesco Technologies GmbH, Regensburg (DE)

(72) Inventors: Franz Pfeilschifter, Walderbach (DE); Sébastien Delepouve, Fonsorbes (FR); Philippe Serrecchia, Villefranche-de-Lauragais (FR)

(73) Assignee: VITESCO TECHNOLOGIES GMBH, Regensburg (DE)

( * ) Notice: Subject to any disclaimer, the term of this patent is extended or adjusted under 35 U.S.C. 154(b) by 180 days.

(21) Appl. No.: 18/835,111

(22) PCT Filed: Jan. 31, 2023

(86) PCT No.: PCT/EP2023/052262
§ 371 (c)(1),
(2) Date: Aug. 1, 2024

(87) PCT Pub. No.: WO2023/148147
PCT Pub. Date: Aug. 10, 2023

(65) Prior Publication Data
US 2025/0147093 A1 May 8, 2025

(30) Foreign Application Priority Data
Feb. 4, 2022 (DE) .................... 10 2022 201 190.2

(51) Int. Cl.
*G01R 31/12* (2020.01)
*B60L 53/60* (2019.01)
(Continued)

(52) U.S. Cl.
CPC ....... *G01R 31/1272* (2013.01); *G01R 31/007* (2013.01); *B60L 53/60* (2019.02)

(58) Field of Classification Search
CPC ...... G01R 27/02; G01R 27/025; G01R 27/08; G01R 31/00; G01R 31/007; G01R 31/12; G01R 31/52; B60L 53/60
See application file for complete search history.

(56) References Cited

U.S. PATENT DOCUMENTS

2014/0084935 A1 3/2014 Chatroux et al.
2016/0096433 A1 4/2016 Gale et al.

FOREIGN PATENT DOCUMENTS

DE 102015116106 A1 4/2016
DE 102019207920 A1 12/2020
(Continued)

OTHER PUBLICATIONS

International Search Report (PCT/ISA/210) and Written Opinion (PCT/ISA/237) with machine translation mailed on May 12, 2023, by the European Patent Office as the International Searching Authority for International Application No. PCT/EP2023/052262, 11 pages.
(Continued)

*Primary Examiner* — Neel D Shah
(74) *Attorney, Agent, or Firm* — Buchanan Ingersoll & Rooney PC

(57) ABSTRACT

A vehicle energy transmission circuit is equipped with an insulation fault detection circuit that has a fault current measurement apparatus, a first high-voltage connector, a second high-voltage connector, a ground potential connector, a first measuring resistor, a second measuring resistor and a measuring switch. One of the high-voltage connectors is connected in series with a connecting point via one of the measuring resistors and the measuring switch. The measuring resistor connects the other high-voltage connector directly to the connecting point. The connecting point is
(Continued)

connected to the ground potential connector via the fault current measurement apparatus. The fault current measurement apparatus is configured to record a current that flows between the connecting point and the ground potential connector. The fault current measurement apparatus is configured to record this current when the measuring switch is open and closed.

11 Claims, 2 Drawing Sheets

(51) Int. Cl.

| | | |
|---|---|---|
| *G01R 27/02* | (2006.01) | |
| *G01R 27/08* | (2006.01) | |
| *G01R 31/00* | (2006.01) | |
| *G01R 31/52* | (2020.01) | |

(56) References Cited

FOREIGN PATENT DOCUMENTS

| | | | |
|---|---|---|---|
| EP | 3489698 A1 | 5/2019 | |
| WO | WO-2016203128 A1 * | 12/2016 | ................ B60L 3/12 |

OTHER PUBLICATIONS

DE Office Action with machine translation issued in corresponding Patent Application No. 2022P00138DE dated Feb. 17, 2023, 12 pages.

Bender, "Insulation Monitoring Device (IMD) for unearthed DC drive systems (IT systems) in electric vehicles", IISOMETER iso165C . . . , Mar. 2021, 6 pages.

Ruffo, "Watch How Hyundai Ioniq 5 Tows And Charges All Your Gear", Motor 1.com, Feb. 23, 2021, 5 pages.

* cited by examiner

SENSING SYMMETRICAL AND ASYMMETRICAL INSULATION FAULTS BY THE ASYMMETRICALLY SWITCHABLE SENSING OF FAULT CURRENT

CROSS REFERENCE TO RELATED APPLICATIONS

This application is the U.S. National Phase Application of PCT International Application No. PCT/EP2023/052262, filed Jan. 31, 2023, which claims priority to German Patent Application No. 10 2022 201 190.2, filed Feb. 4, 2022, the contents of such applications being incorporated by reference herein.

BACKGROUND OF THE INVENTION

It is known practice to equip vehicles with an electrical drive that is operated by a high-voltage rechargeable battery. In this case, voltages of more than 60 V, in particular approximately 400 or 800 V, are used to accommodate the high power requirements.

On the one hand, a connection to this rechargeable battery is necessary to charge it, and on the other hand, there are connections between the on-board electrical system, which includes the rechargeable battery, and external components if these are intended to be supplied with power by the rechargeable battery (or they charge said rechargeable battery). It should therefore be ensured that no dangerous contact voltages occur at the vehicle as a result of the connection to external components (that is to say to a load intended to be supplied with power or to a charging station). To this end, the potentials of the vehicle on-board electrical system are isolated from a chassis potential, whereas charging stations have a ground potential, for example, that is connected to the chassis potential or ground potential of the on-board electrical system.

SUMMARY OF THE INVENTION

An aspect of the invention aims to show a possibility that allows insulation faults to be identified so as to therefore avoid dangerous contact voltages.

As part of a vehicle-based energy transmission circuit, it is proposed to provide an insulation fault detection circuit that not only detects a unilateral fault in a high-voltage potential to ground, but also is able to reliably detect symmetrical insulation faults that may occur, for instance, in a defective charging cable, in the case of which the insulation of both high-voltage potentials is faulty.

An insulation fault detection circuit is proposed, which, in order to detect a fault current, has a first and a second high-voltage connector and a ground potential connector that is connected to the high-voltage connectors via a fault current measurement apparatus. Since both connectors are connected via a respective measuring resistor, fault currents may be detected at both high-voltage potentials as a result, wherein the measuring resistors are used to limit the current flowing in the measurement apparatus. The measuring resistors connect the respective high-voltage connectors to a connecting point that is connected to the ground potential connector via a fault current measurement apparatus. If, therefore, a fault current arises at one of the two high-voltage connectors, it is conveyed through the respective measuring resistor to the fault current measurement apparatus and is able to be detected there.

If a symmetrical insulation fault occurs, the two fault currents that flow through the high-voltage connectors compensate for one another via the connecting point, and so the subsequent fault current measurement apparatus that connects the connecting point to the ground potential connector is not able to fully detect either of the fault currents, and in particular does not detect any current if the two fault currents are compensated for in full.

If, therefore, the fault current measurement apparatus does not record any current flowing therethrough, then either the insulation is fault-free, or there is a symmetrical insulation defect of the high-voltage potentials to ground, in which case the fault currents of the two high-voltage connectors cancel one another out. In order to also identify a symmetrical insulation fault, according to an aspect of the invention, one of the two measuring resistors is therefore connected to a measuring switch in series therewith. One of the two measuring resistors is therefore connected via the measuring switch in series therewith (that is to say connected to one of the connectors via this switch). One of the measuring resistors is then able to be isolated from the respective high-voltage connector or from the connecting point by way of the measuring switch, such that the fault current of the other high-voltage connector is able to be detected completely by the fault current measurement apparatus. If the measuring switch is closed, both high-voltage connectors are therefore connected to the fault current measurement apparatus, and so a faulty, simple (asymmetric) insulation fault to ground is able to be identified. Since the fault current measurement apparatus is also configured to detect the current when the measuring switch is open, in the case of a symmetrical fault, it is possible to thereby avoid the compensation of the fault currents with respect to one another via the connecting point, and so the symmetrical fault current is able to be detected.

The insulation fault detection circuit according to an aspect of the invention or the superordinate vehicle energy transmission circuit may be provided in a cost-effective manner only by adding a switch in series with one of two measuring resistors, wherein the fault current measurement apparatus is also used for both potentials. It is therefore not necessary to provide a separate fault current measurement apparatus for both measuring resistors or for both high-voltage connectors.

A vehicle energy transmission circuit is therefore described, which is designed in particular for high voltage (i.e. voltages greater than 60 V, in particular at least 200 V, 400 V or 800 V). The transmission circuit is present in the vehicle and may in particular be provided between a traction rechargeable battery and connectors that are configured to connect external components such as external consumers or an external charging station. The transmission circuit comprises the insulation fault detection circuit. This detection circuit has a fault current measurement apparatus, a first high-voltage connector, a second high-voltage connector and a ground potential connector. These connectors are configured to connect the detection circuit into the transmission circuit and may be in the form of signal connectors or signal contacts, for example. Since no high currents occur in the insulation fault detection circuit itself, but rather only measurements and detections are carried out, the connectors may be designed for low continuous currents, for example for continuous currents of less than 1 A. Since the high-voltage connectors are designed for high potentials, however, these are preferably equipped with appropriate insulation measures.

The insulation fault detection circuit also has a first and a second measuring resistor. The detection circuit also has a measuring switch. The resistors and the switch are also only designed for measurement purposes and are not power components. The resistors and the switch may be designed for continuous currents of not more than 1 A, in particular since they are only used to detect, but not to guide, a power flow of the transmission circuit. The resistors are preferably in the form of high-voltage resistors. One of the high-voltage connectors of the detection circuit is connected in series with a connecting point via one of the measuring resistors and via the measuring switch. In this case, the measuring resistor may be connected to the high-voltage connector, wherein the measuring switch connects the measuring resistor to the connecting point. Alternatively, the measuring switch may be connected to the high-voltage connector, wherein measuring resistor connects the measuring switch to the connecting point.

There is therefore a series circuit comprising one of the measuring resistors and the measuring switch, wherein this series circuit connects the high-voltage connector to the connecting point. The other measuring resistor connects the other high-voltage connector to the connecting point. The first high-voltage connector may be connected in series with the connecting point via the first measuring resistor and the measuring switch, whereas the second high-voltage connector is connected to the connecting point via the measuring resistor. However, the second high-voltage connector may also be connected in series with the connecting point via the measuring resistor and the measuring switch, whereas the first high-voltage connector is connected to the connecting point directly via the measuring resistor.

The connecting point itself is connected to the ground potential connector via a fault current measurement apparatus. The fault current measurement apparatus itself conductively connects the connecting point to the ground potential connector. The fault current measurement apparatus may in particular have a shunt resistor (or a measuring resistor) to determine the fault current by way of a voltage drop across this resistor. Alternatively, the fault current measurement apparatus may also have a line that connects the connecting point to the ground potential connector, wherein a magnetic sensor, in particular a Hall sensor, is provided to record the magnetic field generated by the fault current (the magnetic field surrounding the conductor). The line may also be magnetically coupled to a winding across which a voltage drops that is proportional to the first time derivative of the fault current. This also allows the fault current to be recorded. The fault current measurement apparatus is therefore equipped with a current sensor that connects the connecting point to the ground potential connector (directly or indirectly, in particular via a measuring switch).

The fault current measurement apparatus is configured to record a current that flows between the connecting point and the ground potential connector. The fault current measurement apparatus is therefore configured to record a current that flows through it. The fault current measurement apparatus may output a signal that reflects the level of the current. The fault current measurement apparatus is configured to record this current when the measuring switch is open (as a first value), and is additionally configured to record this current when the measuring switch is closed (as a second value). The fault current measurement apparatus is therefore configured to output a first value that reflects the current when the measuring switch is open, and to output a second value that reflects the current when the measuring switch is closed. In this case, the fault current measurement apparatus may be connected to the measuring switch for actuation purposes in order to suitably open or close said measuring switch. However, provision may also be made of a super-ordinate control apparatus that is connected to the fault current measurement apparatus, and to the measuring switch for actuation purposes. This control apparatus may then coordinate or synchronize the opening of the measuring switch and the measurement by the fault current measurement apparatus. The fault current measurement apparatus may in particular have a data output via which signals may be output that reflect the current when the measuring switch is open and the current when the measuring switch is closed. The fault current measurement apparatus may be configured to output a first fault signal in the event of a current that is above a limit value being recorded by this apparatus if the current is flowing when the measuring switch is open, and to output a second fault signal if the current recorded by the apparatus is above the limit value but is recorded when the measuring switch is closed. The first-mentioned fault reflects a symmetrical insulation fault and the second-mentioned fault reflects an asymmetrical insulation fault.

In the case of a symmetrical insulation fault, the potentials of both high-voltage connectors are connected to the ground potential connector or the potential via an insulation resistor with an excessively low value, and in the case of an asymmetrical fault, only one potential of one of the two high-voltage connectors is connected to the potential of the ground potential connector via an insulation resistor with an excessively low value. The limit value required for this may be a limit value that results from a standard or that reflects a limit above which there is a possibility of damage to a person through which a current of this magnitude flows.

The fault current measurement apparatus is configured to output an asymmetrical insulation fault if the current is greater than a fault current limit when the measuring switch is closed, and is also configured to output a symmetrical fault if the current is greater than the fault current limit when the measuring switch is open. There may also be different fault current limits provided for open and closed switches. The fault current limit corresponds in particular to the above-mentioned limit value. As mentioned, the fault current measurement apparatus or the vehicle energy output circuit may have a signal output at which a signal that reflects the fault type is output.

A voltage monitoring circuit is preferably provided in addition to the fault current detection by means of the fault current measurement apparatus and the associated measuring resistors or associated measuring switch (that is to say in addition to the fault-current-based circuit). Said voltage monitoring circuit can be considered to be a further insulation fault detection circuit. Alternatively, the voltage monitoring circuit and the fault-current-based circuit described here, which comprises the fault current measurement apparatus and the measuring resistors and the measuring switch, may be considered to be part of a common insulation fault detection circuit.

The voltage monitoring circuit also has a first and a second high-voltage connector, and a ground potential connector. Said connectors may be provided separately from the respective connectors of the fault-current-based circuit, but are preferably provided together with them. This makes it easier to connect the voltage monitoring circuit and the fault current measurement apparatus to the vehicle energy output circuit.

The voltage monitoring circuit has a voltage symmetry detection means. The voltage monitoring circuit or the voltage symmetry detection means is therefore configured to detect whether the potentials of the high-voltage connectors are symmetrical with respect to the ground potential connector, or whether there is a deviation in the symmetry. The voltage symmetry detection means is configured to ascertain a deviation in the symmetry of the potentials of the high-voltage connectors with respect to the ground potential connector. The voltage symmetry detection means is therefore a circuit that is configured to detect the deviation in the voltage symmetry of the high-voltage connectors with respect to the ground potential connector. The voltage symmetry detection means may have separate resistors in order to record the voltage applied thereto, or may be formed by means of the measuring resistors of the fault current measurement apparatus so as to record the voltages dropped there. The respective circuit in particular has a voltage measurement apparatus that is configured to detect the deviation in the symmetry. The voltage symmetry detection means is preferably configured to open the measuring switch if the deviation is less than a predetermined voltage asymmetry limit. In this case, the voltage symmetry detection means is connected to the measuring switch for actuation purposes. If, therefore, the voltage symmetry detection means detects a deviation in the symmetry that is less than said voltage asymmetry limit, there may either be no insulation fault, or there may be a symmetrical insulation fault, that is to say a bilateral insulation fault to ground potential. Preferably, the insulation fault detection circuit is configured to open the measuring switch only if the deviation is less than the predetermined voltage asymmetry, on the one hand, and if the current that is ascertained by the fault current measurement apparatus is less than a fault current limit, on the other hand. For this purpose, there may be a logic AND gate that logically combines both conditions. The voltage asymmetry limit may be presented as proportion-based information that reflects the voltage ratio between the first high-voltage connector and the ground potential connector, and the second high-voltage connector and the ground potential connector (in particular as a magnitude). The voltage asymmetry limit may also be presented as the (maximum) difference between the magnitudes of these voltages.

The voltage symmetry detection means or the associated circuit may be partially formed by means of the measuring resistors of the fault current measurement apparatus. The voltage symmetry detection means comprises a voltage measurement apparatus that is connected to the measuring resistors and is configured to record the voltage dropped across the measuring resistors. In this case, the voltage measurement apparatus may be connected to both ends of the measuring resistors in each case. The connection between the voltage measurement apparatus and the measuring resistors may include a voltage divider. The voltage measurement apparatus is configured to ascertain the deviation in the symmetry as a difference in the magnitudes of these voltages. The voltage measurement apparatus may also be connected directly to the high-voltage connectors and the ground potential connector without additional resistors or without a direction connection to both ends of the measuring resistors (of the fault-current-based circuit) in each case. The voltage measurement apparatus may have voltage dividers in order to adapt the measurement voltages to inputs of a voltage measurement unit (A/D converter).

Alternatively the voltage symmetry detection means or the circuit thereof has separate voltage measuring resistors. The voltage measuring resistors are connected between the ground potential connector, on the one hand, and the high-voltage connectors, on the other hand (directly or indirectly via resistors of a voltage divider). The voltage symmetry detection means has a voltage measurement apparatus that is connected to the voltage measuring resistors (in particular directly or via voltage dividers). The voltage measurement apparatus is configured to record the voltages dropped across the voltage measuring resistors, and is also configured to ascertain the deviation in the symmetry as a difference in the magnitudes of these voltages. When using two dedicated voltage measuring resistors to represent the voltage symmetry detection means, they may be connected, on the one hand, to the high-voltage connectors, and, on the other hand, on the opposite side, to a voltage recording connecting point that in turn is connected to the ground potential connector directly or via a switch. The insulation fault detection circuit may be intended to provide this switch ("measuring switch of the voltage monitoring circuit") in the open state if the voltage symmetry detection means is inactive, and it may be closed if the voltage symmetry detection means is active.

The voltage symmetry detection means may be repeatedly and preferably periodically active and may be inactive between the time periods in which it is active. Interference from an active insulation detection device is avoided by disconnecting the voltage measuring resistors from the ground potential connector during inactive periods of the voltage symmetry detection means (by means of the respective measuring switch). This also applies to the fault-current-based circuit, the measuring switch of which may accordingly be opened. The energy output circuit is preferably configured to activate an active insulation detection circuit if said switch is open, and to deactivate an active insulation detection circuit if said switch is closed.

The vehicle energy transmission circuit preferably has two voltage rails with different potentials to which the high-voltage connectors (of the voltage symmetry detection means and/or the fault-current-based circuit or the resistors and measurement apparatus thereof) are connected directly or via series resistors, fuses and/or switches. The energy transmission circuit is configured to transmit a current that is used to transmit energy via the busbars. The busbars are electrically insulated from a ground potential, in particular via the ground potential connector. The busbars may be AC busbars or DC busbars.

The energy transmission circuit may have two ends, between which this energy is able to transmit, wherein both ends have a power connector in each case. The busbars are provided between these ends or power connectors, wherein the busbars may connect both ends to one another directly, or wherein one or more power converters and/or converters may be provided, via which the busbars are connected to the respective ends of the energy transmission circuit.

The high-voltage connectors of the insulation fault detection circuit are connected to the rails so as to be able to record a current flowing through the fault current measurement apparatus and if necessary to also make it possible to detect a deviation in the symmetry of the potentials of the high-voltage connectors by the voltage symmetry detection means.

Two AC connectors may be provided as power connectors of the energy transmission circuit, wherein the busbars are provided as AC busbars. The AC busbars are connected to the AC connectors. The energy transmission circuit may also have two DC connectors, wherein the busbars are in the form of DC busbars. These are connected to the DC connectors. Provision may also be made for the vehicle energy transmission circuit to have two AC connectors as power connectors, and two DC busbars as busbars. In this case, the DC busbars are connected to the DC connectors via a rectifier apparatus (or an inverter apparatus). The rectifier apparatus may be configured unidirectionally or bidirectionally. The rectifier apparatus or inverter apparatus may be in the form of a power factor correction filter, or comprise such a filter. The rectifier apparatus may be a controlled rectifier apparatus or an uncontrolled rectifier apparatus. The rectifier apparatus or inverter apparatus may be galvanically isolating.

The insulation fault detection circuit (or the fault-current-based circuit) is preferably configured to compare the recorded current with a current limit. To this end, said circuit may have a comparator or a functionally equivalent apparatus, for example implemented as a program section in a microprocessor. The insulation fault detection circuit is configured to open an isolating switch, to activate a discharge circuit, to deactivate or disconnect an external energy source and/or to deactivate a rectifier apparatus or an inverter apparatus or a power converter apparatus if the current exceeds the current limit. The voltage symmetry detection means may also be configured to open an isolating switch, to activate a discharge circuit and/or to deactivate a rectifier apparatus, power converter apparatus or inverter apparatus if a deviating symmetry that is greater than a voltage asymmetry limit is detected.

In particular, the voltage symmetry detection means is configured to ascertain the difference in the magnitudes of the recorded voltages and to compare this to a voltage asymmetry limit, wherein the voltage symmetry detection means is also configured to output a fault signal if the voltage asymmetry limit is exceeded. To this end, the voltage measurement apparatus may have a signal output at which it outputs a signal that outputs a corresponding asymmetry fault. In particular, the voltage symmetry detection means outputs different fault types depending on the position of the measuring switch.

In this case, a switch that is provided between the ends of the energy transmission circuit (in particular connected directly downstream of an input of the transmission circuit) and, in the open state, interrupts the flow of current between the ends of the energy transmission circuit, is referred to as an isolating switch. A circuit that is provided at an energy storage unit, such as an intermediate capacitor, and that is configured, in the active state, to discharge said energy storage unit, is also referred to as a discharge circuit. In particular, the energy transmission circuit is configured to deactivate a voltage converter if the current limit and/or the voltage asymmetry limit is exceeded. One aspect is that the deactivation is carried out only if the current limit and/or the voltage asymmetry limit is exceeded over a predefined time period. This is also referred to as debouncing. In addition, only a first subset of these measures is able to be implemented when the respective limit is slightly exceeded by the deviation or by the detected (fault) current, whereas all of the measures or a second subset of these measures are carried out when the exceedance is comparatively more significant, wherein the second subset comprises the first subset in addition to at least one further measure.

The fault current measurement apparatus may be connected to the ground potential connector via a grounding switch. Similarly, the voltage symmetry detection means may also be connected to the ground potential connector via a grounding switch. If the voltage symmetry detection means comprises the measuring resistors of the fault current detection circuit as the voltage measuring resistors, then the grounding switch of the fault current measurement apparatus preferably corresponds to the grounding switch via which the voltage symmetry detection means is connected to the ground potential connector.

The energy transmission circuit may have a grounding switch actuation means, which is connected to the grounding switch or the grounding switches (connected to the fault current detection circuit and/or the voltage detection circuit) for actuation purposes. The grounding switch actuation means is configured to provide the grounding switch or the grounding switches in the open state, or to open said grounding switch or grounding switches, if an insulation testing device of the vehicle energy transmission circuit is active. The insulation testing device is in particular an active insulation testing device that injects or applies a measurement current or a measurement voltage into or to the system to be tested (that is to say into or to the energy transmission circuit). In order to prevent the insulation testing device from detecting, amongst other things, the closed grounding switch, this is opened if the insulation testing device is active. In addition, the grounding switch is or the grounding switches are preferably open if the vehicle energy transmission circuit is not transmitting any power, that is to say if there is essentially no current flowing through the busbars. The grounding switch actuation means is accordingly configured to actuate said grounding switches.

The energy transmission circuit may be in the form of a unidirectional or bidirectional charging circuit. In particular, the energy transmission circuit may be designed for feeding back. The energy transmission circuit may be in the form of a DC or AC charging circuit, that is to say it may be designed for an external supply of DC current or for AC current. In particular, the energy transmission circuit may be in the form of a supply circuit for external consumers that is preferably designed to generate AC voltage. By way of example, in this case, an external consumer, such as a drill or a hairdryer, may be connected to an energy source and fed by said energy source that is connected to the energy transmission circuit.

DETAILED DESCRIPTION OF EXEMPLARY EMBODIMENTS

Figure 1:
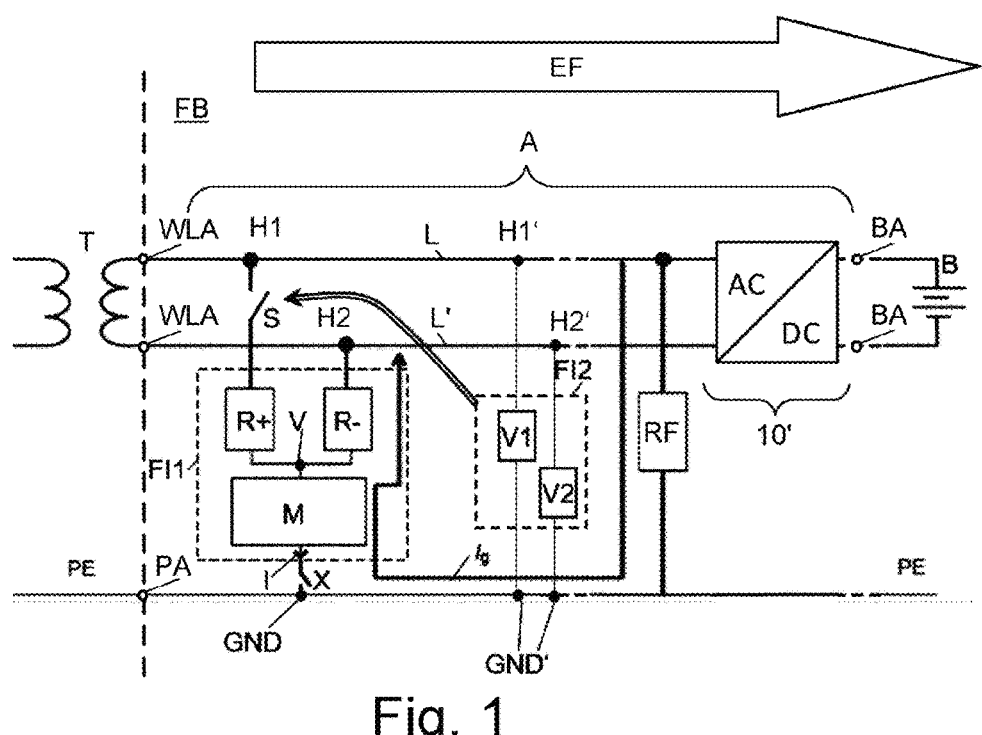
FIGS. 1 to 4 show exemplary vehicle energy transmission circuits in different application environments and are used to illustrate exemplary embodiments in more detail.

FIG. 1 shows a vehicle energy transmission circuit A, within a vehicle on-board electrical system FB, that is connected to an external charging station. The interface of the vehicle on-board electrical system FB or of the energy transmission circuit A to the external component (in FIG. 1: an external on-board electrical system) is shown using a dashed line. The vehicle energy transmission circuit A comprises two AC connectors WLA that are configured to be connected to an external component, in particular to a charging station. The AC connectors WLA are charging connectors and in particular are designed according to a standard for conductive charging. The AC connectors WLA or DC connectors GLA in FIGS. 1 to 4 are configured to be connected to external components.

A protective conductor PE is provided both externally to and internally in the transmission circuit A. The phase transmission circuit also comprises a protective conductor connector PA, via which a protective conductor PE of the transmission circuit A is connected to an external protective conductor PE. The AC connectors WLA and the protective conductor connector PA (in FIGS. 1-4) may be designed jointly, in particular in the form of a charging socket or generally in the form of a common plug connecting module that is able to be contacted externally by plugging in.

The charging station connected to the transmission circuit A is represented by a transformer T that has two phase connectors (of two outer phases) that are connected to the AC connectors WLA. It can be seen that there is no connection between the two connectors of the transformer and the protective conductor PE, that is to say no connection between a neutral conductor and a protective conductor PE. This is an IT system in which both phase connectors of the transformer are isolated from the protective conductor even on the supply network side.

Within the vehicle transmission circuit there is a first and a second AC busbar L, L− that connect the AC connectors WLA to battery connectors BA of the transmission circuit A, in particular via a rectifier circuit 10', the AC side AC of which is connected to the two AC busbars L, L− of the transmission circuit A. The rectifier circuit 10' may have a preferably controlled (or else uncontrolled) rectifier. Preferably, the rectifier circuit 10' also comprises, in addition to the rectifier, a DC/DC converter in order to convert the DC voltage that is generated by the rectifier into another DC voltage, in order to output the converted DC voltage to the battery connector BA.

The two ends of the transmission circuit A are formed by the battery connectors BA, on the one hand, and the AC connectors WLA, on the other hand. Respective grounding connectors may still be assigned to the ends. The transmission circuit may have a grounding busbar (cf. potential GND) that preferably extends from one end to the other.

A battery B, which is in particular in the form of a high-voltage traction rechargeable battery, is connected to the battery connectors BA. In order to show that further components may also be provided between the battery and the rectifier circuit 10', for instance isolating switch fuses or the like (in particular also DC/DC converters), the corresponding connection at the connectors BA is shown using a dashed line. An energy flow direction EF leads from the AC connectors WLA to the battery connectors BA and represents, for example, the transmission of charging energy from the charging station (to the left of the on-board electrical system FB) to the battery B.

An insulation fault detection circuit FI1 and a voltage monitoring circuit FI2 are shown in the figures. Both are represented as separate circuits so as to therefore represent their separate functions. In this case, the insulation fault detection circuit FI1 is used for fault current detection and the voltage monitoring circuit FI2 is used for monitoring the symmetry of the potentials of the busbars L, L− with respect to the potential of the circuit breaker PE or of the grounding connectors GND. This merely serves to schematically clarify that there are different functions. As already mentioned, the circuits may be combined in terms of circuitry, however, wherein elements (in particular the resistors R+, R−) are used both by the voltage monitoring circuit FI2 and by the insulation fault detection circuit FI1. For this reason, a combined circuit may also be referred to as an insulation fault detection circuit, to which the two reference signs FI1, FI2 are assigned. The insulation fault detection circuit with the reference sign FI1 in particular comprises the fault-current-based circuit. The insulation fault detection circuit with the reference sign FI2 in particular corresponds to the voltage monitoring circuit that is equipped with a voltage symmetry detection means V1, V2. The reference signs V1, V2 in particular relate to two voltage measurement apparatuses for recording the voltages between the connectors H1', H2', on the one hand, and the connector GND', on the other hand. Since the connectors H1', H2' and GND' have the same potential as the connectors H1, H2 and GND, these may also be equated or be implemented by the same connectors.

In the figures, the insulation fault detection circuit FI1 comprises a fault current measurement apparatus M and a first measuring resistor R+ and a second measuring resistor R−. If these measuring resistors are connected to DC busbars, the reference signs represent the polarity, and if they are connected to AC busbars, the different reference signs R+, R− are merely used to distinguish between the resistors.

In the figures, the insulation fault detection circuit FI1 has a first high-voltage connector H1 and a second high-voltage connector H2, and a measuring switch S. The first high-voltage connector H1 is connected to the first measuring resistor R+ via the measuring switch S, which measuring resistor leads to a connecting point V. The second high-voltage connector H2 is connected to the connecting point V via the second measuring resistor R−. If the high-voltage connectors H1, H2 are connected to DC busbars, the reference signs of the measuring resistors represent the polarity. In the case of a use, as shown in FIG. 1, with AC busbars, the reference signs of the measuring resistors merely represent the fact that different potentials are involved, specifically the potentials L, L−. In the figures, the connecting point V is also connected to a ground potential connector GND of the fault current measurement apparatus via a fault current measurement apparatus M, in particular via the (optional) switch X. If, on account of an insulation fault RF, a current flow is therefore flowing, in particular a fault current between the AC voltage potential L (or the respective busbar) and the potential of the circuit breaker PE or of the ground potential connector GND, then a fault current Ig is flowing, which is able to be detected when the measuring switch S is closed. It should be taken into consideration here that the insulation fault detection circuit FI1 is connected both to the potential L and to the potential L− (or to the potentials DC+, DC−), and it is therefore possible to detect fault currents that may flow between the potential GND and one of the two busbars L, L− (or potentials DC+, DC−) on account of an insulation fault. (Since the busbars each carry a particular potential, on account of the unique assignment, the same reference sign is used for the busbars as for the respective potentials).

If, in the figures, both busbars L, L− (or DC+, DC−) are not sufficiently isolated from the protective conductor potential GND of the protective conductor PE due to a double insulation fault, two fault resistors RF are notionally produced, which connect the potential of PE to L and to L− (or DC+, DC−). A fault current would then flow through both measuring resistors R+, R−, but these fault currents would be able to be compensated for on account of the connection via the connecting point V. The current I, which is to be measured, of the fault current measurement apparatus M would therefore only be able to capture the sum of the two currents through R+ and R−, which cancel one another out or compensate for one another on account of opposite arithmetic signs. For this reason, the measuring switch S may be opened such that the compensation of the fault currents for the fault current measurement apparatus is prevented, and one of the two fault currents through H2, R− and M is able to be detected. As a result, symmetrical insulation faults are able to be detected, and in particular it is possible to distinguish between a current I that is zero, since there is no insulation fault RF, and a current I that is zero or relatively low, since the fault currents to be detected cancel one another out via the connecting point V.

In the figures, a voltage monitoring circuit FI2 is used to record the voltages between the circuit breaker PE or the ground potential connector GND, on the one hand, and the potentials of the AC busbars L, L−, on the other hand. To this end, the voltage monitoring circuit has two high-voltage connectors H1− and H2− that are connected to the busbars L, L−. A voltage symmetry detection means V1, V2 comprises two voltage measurement apparatuses that are able to record the voltage between H1− and GND−, or H2− and GND−. Furthermore, the voltage monitoring circuit FI2 is configured to compare the voltages thus recorded in order to therefore be able to detect a deviation in the symmetry of the potentials of the high-voltage connectors H1−, H2−. In particular, for this purpose, the voltage symmetry detection means may be configured to compare the magnitudes of the voltages between H1− or H2− and GND− with one another and to identify asymmetry when a deviation is greater than a predefined asymmetry limit. If such asymmetry is identified, a fault signal is able to be output. In particular, the voltage monitoring circuit FI2 has an output that is connected to the measuring switch S of the insulation fault detection circuit FI1 for actuation purposes. If the voltage symmetry detection means V1, V2 (or FI2) detects a deviation that is greater than a voltage asymmetry limit, the switch S may then remain closed. If the deviation in the symmetry is less than said limit, the switch S may be opened in order to ascertain whether there is no insulation fault (M would then measure a fault current below a fault current limit), or whether a symmetrical insulation fault occurs (M would then detect a fault current I greater than a fault current limit).

As mentioned, the voltage monitoring circuit and the fault-current-based insulation fault detection circuit are shown separately with the reference signs FI1, FI2 in order to symbolically show the different types of measurement. Preferred embodiments make provision for the voltage symmetry detection means to have one or two measurement apparatuses that are able to record the voltage across the resistors R+, R−. In particular, the high-voltage connectors H1, H1− may be provided as a common connector. This also applies to the connector H2−. In particular, the ground potential connectors GND' may also be combined to form one connector and may in particular be designed as a common connector together with the ground potential connector GND, via which the insulation fault detection circuit FI1 is connected.

The switch X is used to avoid interference from further insulation monitoring circuits and is preferably open if the fault current measurement apparatus or the insulation fault detection circuit FI1 is inactive. In particular, the switch X, which is also referred to as a grounding switch, may be open if the voltage monitoring circuit FI2 is active and carries out a measurement operation. In particular, the grounding switch X is open if an insulation fault monitoring means, which is not shown, of the shown on-board electrical system actively injects a measurement current for insulation resistance detection purposes.

Figure 2:
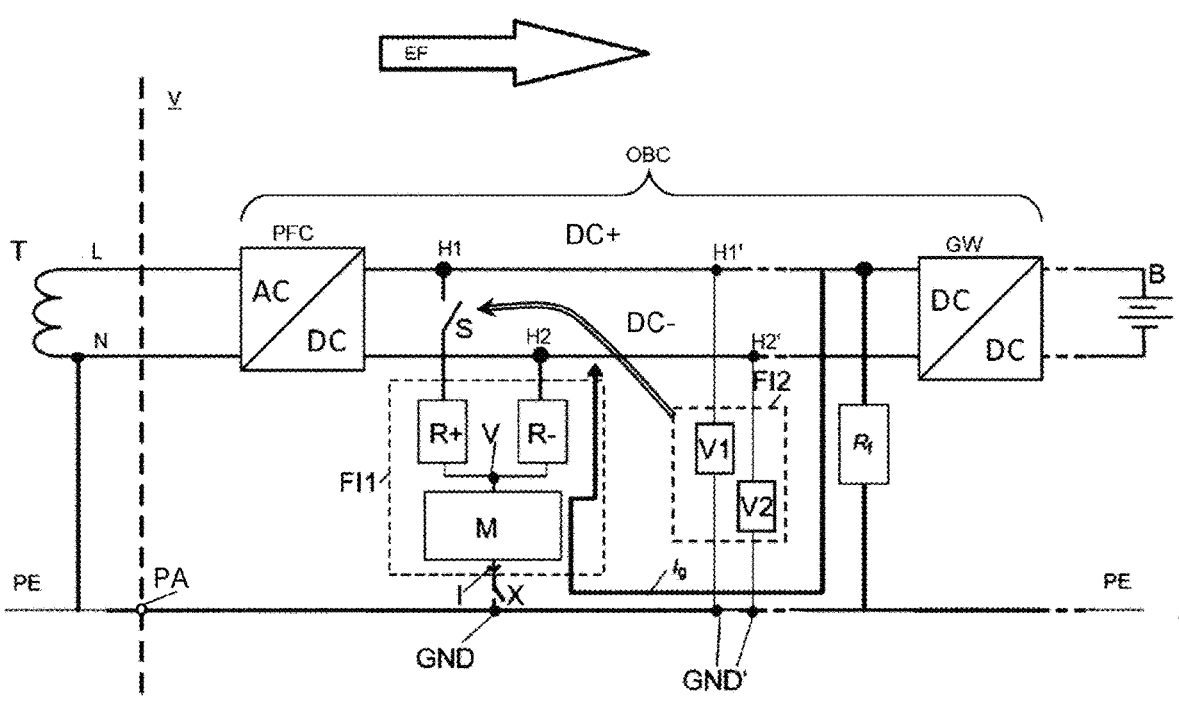
Figure 3:
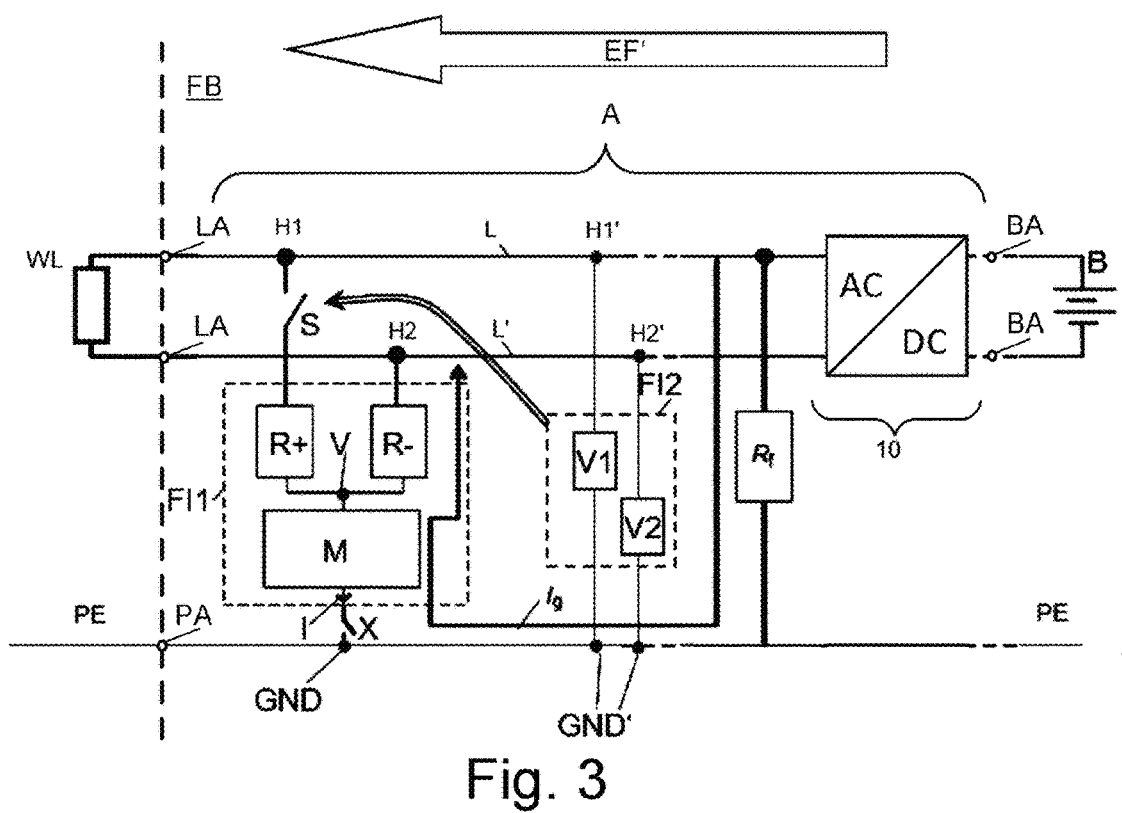
Figure 4:
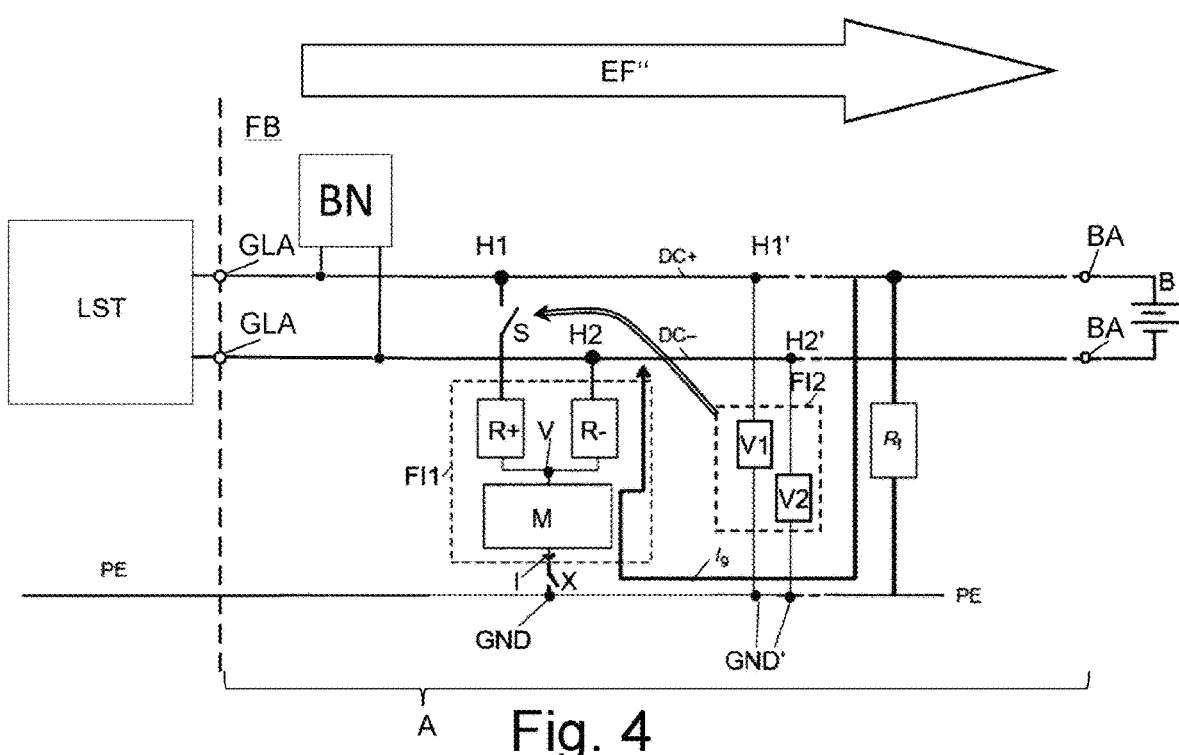

FIG. 2 and further FIGS. 3 and 4 have insulation fault detection circuits and a voltage monitoring circuit like FIG. 1. In contrast to FIG. 1, FIG. 2 shows a charging station in which there is a neutral conductor N, which is connected to the PE conductor of the power supply system, in addition to an outer phase. Such a connection between the neutral conductor N or a connector of the transformer and the protective conductor PE is, for example, used in public power supply systems in Germany and may be referred to as a TN-C-S system. In FIG. 2, as well as in FIG. 1, this then results in decoupling of the on-board electrical system BN from the connected charging station if a rectifier circuit as shown by PFC in FIG. 2 is present. The shown rectifier circuit PFC may be in the form of a power factor correction filter and is connected on the AC side to the AC connectors WLA of the energy transmission circuit A. A first and a second DC busbar DC+, DC− are connected to the rectifier circuit PFC on the DC side.

An optional DC/DC converter GW is also shown, which connects the DC busbars DC+, DC− to the battery connectors BA. Also in FIG. 2, the AC connectors WLA are to be assigned to the energy transmission circuit A, wherein the high-voltage connectors H1, H2 of the insulation fault detection circuit FI1 and the high-voltage connectors H1−, H2− of the voltage monitoring circuit FI2 are not connected to the AC connectors WLA of the transmission circuit A, but to the D2 busbars DC+, DC−, which are connected to the AC connectors WLA via the rectifier circuit PFC. The properties for insulation fault detection, as have also been shown in FIG. 1, are obtained.

Also in FIG. 2, the two circuits FI1, FI2 may be designed jointly for the most part, wherein, in order to form the voltage monitoring circuit FI2, a measurement apparatus that is able to record the voltage between the high-voltage connectors and the ground potential connector GND is required. If an insulation fault of the DC busbars DC+, DC− to GND occurs, as shown by the insulation fault RF, the fault current Ig may occur, which may be detected, as current I, by the insulation fault detection circuit FI1. The high-voltage connectors H1, H2 and H1' and H2' are different potentials and are therefore assigned to different DC busbars DC+, DC−. The rectifier circuit PFC may be designed to be galvanically connecting or galvanically isolating. Alternatively to FIG. 1, the circuits FI1, FI2 may also be provided on the AC side at the rectifier circuit PFC, in particular at the potentials of the AC connectors WLA. In this case, the high-voltage connectors of the circuits FI1, FI2 may be connected to AC busbars that connect the connectors WLA to the rectifier circuit PFC. The rectifier circuit PFC may in particular be bidirectional, but is designed to be unidirectional in simple embodiments. When power is supplied via the AC connectors WLA, there is a flow of energy EF that goes in the direction of the battery connectors BA of the transmission circuit A and that leads to the battery B of the vehicle on-board electrical system FB illustrated.

While FIGS. 1 and 2 show a case of charging with regard to the energy transmission directions, FIG. 3 shows a case of energy transmission starting from the battery connectors BA or the battery B, in order to be able to output energy at load connectors LA of the energy transmission circuit. An AC load WL, for instance a drill or the like, is connected externally to the vehicle on-board electrical system FB of FIG. 3 that comprises the load connectors LA. The load connectors LA may be designed according to a standard for designing a socket outlet, in particular according to a CEE standard (CEE 7/x), according to a NEMA standard, which defines socket outlets, or according to another standard that defines the design of household socket outlets. In particular, the load connector LA is designed according to a standard for configuring two contact plugs, that is to say plugs without a grounding connector. Preferably, the load connector LA is, however, designed jointly with a protective conductor connector PA and forms a common connector socket. The connectors LA and PA may therefore be formed within a socket outlet that is designed in particular according to a standard for designing household socket outlets with a protective contact. By way of example, a Schuko socket may be provided that has the contacts LA and PA. Alternatively, a socket for a Europlug may be formed, wherein the socket comprises the contacts LA. There is a flow of energy EF' from the battery connector BA to the charging connector LA. It is merely shown that the external AC load is only connected to the charging connectors LA. However, there may also be an AC load WL provided that also has a protective conductor that is connected to the connector PA.

FIG. 4, like FIGS. 1 and 2, relates to an application of the transmission circuit according to an aspect of the invention for implementing a charging operation. While FIGS. 1 and 2 relate to an AC charging operation in which an AC current is applied to the AC charging connectors for charging, FIG. 4 relates to a charging operation in which DC voltage charging connectors are provided, and a DC voltage is applied to these connectors for charging. In addition, it should be noted that FIG. 1 shows a use of the insulation fault detection circuit and the voltage monitoring circuit FI1, FI2 for monitoring AC busbars L, L', whereas FIG. 2 shows the monitoring of DC busbars DC+, DC− by means of said circuits FI1, FI2. FIG. 3 also shows a use of the insulation fault detection circuit FI1, FI2 according to an aspect of the invention for monitoring potentials of AC busbars, wherein, however, in FIG. 3, the flow of energy EF_ flows toward the charging connectors, whereas, in FIGS. 1, 2 and 4, it flows from the charging connectors WLA, GLA toward the battery connectors BA.

FIG. 4 therefore shows a DC voltage charging application in which the vehicle energy transmission circuit A has DC charging connectors GLA, in particular a positive and a negative connector. Two busbars DC+, DC− are attached to these connectors. The high-voltage connectors of the insulation fault detection circuit FI1, FI2 are connected to said busbars in order to detect a fault current and a voltage symmetry of the potentials of DC+, DC−, on the one hand, with respect to the potential of the protective conductor PE, on the other hand (that is to say with respect to the ground potential connectors GND, GND−). In FIG. 4, a DC charging station LST is connected to the energy transmission circuit A, that is to say to the DC charging connectors GLA thereof. A protective conductor PE also leads to the vehicle energy transmission circuit A without, however, being connected to the potentials of the DC voltage charging station or to the high-voltage potentials thereof. FIG. 4 also shows an on-board electrical system or an on-board electrical system section BN, which is connected to the DC busbars DC+, DC− in order to be supplied with power thereby. In the on-board electrical system section BN, provision may in particular be made of an inverter, for example a traction inverter, a low-voltage DC/DC converter, an air-conditioning compressor drive, or the like.

FIG. 4 also shows the insulation fault detection circuit FI1, which is directed toward fault current detection, and the voltage monitoring circuit FI2 separately. However, as well as in the preceding figures, this serves only to show the different functions and to show that the voltage monitoring circuit FI2 is configured, according to the double arrow shown, to actuate the measuring switch S. This is in particular carried out if the current I recorded by the fault current measurement apparatus M is below a predefined current limit, and it therefore remains to be decided whether there is no insulation fault, or whether there is a symmetrical insulation fault. In particular, the voltage monitoring circuit FI2 opens the switch S only if said voltage monitoring circuit detects a deviation in a voltage symmetry that is less than an asymmetry limit. If this is the case, this may be because there is no fault, or because there is a symmetrical fault.

In the embodiments shown, the voltage monitoring circuit FI2 may also be connected to the switch X for actuation purposes, which switch switchably connects the fault current measurement apparatus M to the ground potential connector GND. The voltage monitoring circuit FI2 then actuates the switch X to the closed state if a deviation in the voltage symmetry is less than a predefined asymmetry limit value. An active insulation fault detection apparatus may be provided, which detects the insulation with respect to the ground potential GND actively, that is to say by impressing a measurement current. This may be connected to the switch X directly or indirectly for actuation purposes and open said switch if the active insulation fault detection apparatus impresses the measurement current. A superordinate controller may also be provided, which opens the switch X if it actuates the insulation measurement apparatus to impress a measurement current.

The insulation fault detection circuit FI1, as shown in FIGS. 1 to 4, may also be referred to as a fault current detection unit, since it is configured in FIGS. 1 to 4 for this purpose. The voltage monitoring circuit FI2 shown in FIGS. 1 to 4 is shown symbolically separated from the device FI1 in FIGS. 1 to 4. However, as mentioned, the resistors R+, R− of the circuit FI1 may also be used to show the functions of the voltage monitoring circuit FI2. This also applies to the connectors H1', H2' and GND', which may be identical to the connectors H1, H2 and GND. Therefore, the combination of the circuits FI1, FI2 shown may also be considered to be an insulation fault detection circuit, wherein the different reference signs are different primarily to distinguish the function, but may be designed as an at least partly common circuit.

The invention claimed is:

1. A vehicle energy transmission circuit comprising an insulation fault detection circuit that has a fault current measurement apparatus, a first high-voltage connector, a second high-voltage connector, a ground potential connector, a first measuring resistor, a second measuring resistor and a measuring switch, wherein one of the high-voltage connectors is connected in series with a connecting point via one of the measuring resistors and the measuring switch, and the other one of the measuring resistors connects the other one of the high-voltage connectors directly to the connecting point, wherein the connecting point is connected to the ground potential connector via the fault current measurement apparatus and the fault current measurement apparatus is configured to record a current that flows between the connecting point and the ground potential connector, wherein the fault current measurement apparatus is configured to record this current when the measuring switch is open and when the measuring switch is closed.

2. The vehicle energy transmission circuit as claimed in claim 1, wherein the fault current measurement apparatus is configured to output an asymmetrical insulation fault if the current is greater than a fault current limit when the measuring switch is closed, and is also configured to output a symmetrical fault if the current is greater than the fault current limit when the measuring switch is open.

3. The vehicle energy transmission circuit as claimed in claim 2, wherein the insulation fault detection circuit also has a voltage monitoring circuit that has a first high-voltage connector, a second high-voltage connector, a ground potential connector, and voltage symmetry detector that is configured to ascertain a deviation in the symmetry of the potentials of the high-voltage connectors with respect to the ground potential connector and to open the measuring switch if the deviation is less than a predetermined voltage asymmetry limit.

4. The vehicle energy transmission circuit as claimed in claim 1, wherein the insulation fault detection circuit also has a voltage monitoring circuit that has a first high-voltage connector, a second high-voltage connector, a ground potential connector, and voltage symmetry detector, that is configured to ascertain a deviation in the symmetry of the potentials of the high-voltage connectors with respect to the ground potential connector and to open the measuring switch if the deviation is less than a predetermined voltage asymmetry limit.

5. The vehicle energy transmission circuit as claimed in claim 4, wherein the voltage symmetry detector has voltage measuring resistors that are implemented by the measuring resistors of the fault current measurement apparatus, and the voltage symmetry detector also has a voltage measurement apparatus that is connected to the measuring resistors and is configured to record the voltages dropped across the measuring resistors and to ascertain the deviation in the symmetry as a difference in the magnitudes of these voltages, or wherein the voltage symmetry detector has two dedicated voltage measuring resistors that are connected to the high-voltage connectors of the voltage monitoring circuit, on the one hand, and to the ground potential connector of the voltage monitoring circuit, on the other hand, and the voltage symmetry detector has a voltage measurement apparatus that is connected to the voltage measuring resistors and is configured to record the voltages dropped across the voltage measuring resistors and to ascertain the deviation in the symmetry as a difference in the magnitudes of these voltages.

6. The vehicle energy transmission circuit as claimed in claim 1, which has two AC busbars or two DC busbars having two different potentials, wherein the rails are galvanically isolated from a ground potential, and wherein the first and the second high-voltage connector of the insulation fault detection circuit are connected to the rails.

7. The vehicle energy transmission circuit as claimed in claim 6, which has two AC connectors and the two AC busbars that are connected to the AC connectors, the vehicle energy transmission circuit has two DC connectors and the two DC busbars that are connected to the DC connectors, or the vehicle energy transmission circuit has two AC connectors and the two DC busbars that are connected to the DC connectors via a rectifier apparatus.

8. The vehicle energy transmission circuit as claimed in claim 1, wherein the insulation fault detection circuit is configured to compare the recorded current with a current limit and is configured to open an isolating switch, to activate a discharge circuit and/or to deactivate a rectifier apparatus or a power converter apparatus if the current exceeds the current limit, in particular over a predefined time period.

9. The vehicle energy transmission circuit as claimed in claim 1, which has a grounding switch, wherein the connecting point is connected to the ground potential connector via the fault current measurement apparatus and via this grounding switch.

10. The vehicle energy transmission circuit as claimed in claim 1, which also has a grounding switch actuator, which is connected to the grounding switch for actuation purposes and is configured to provide the grounding switch in the open state if an insulation testing device of the vehicle energy transmission circuit is active and/or if the vehicle energy transmission circuit is not transmitting any power.

11. The vehicle energy transmission circuit as claimed in claim 1, which is in the form of a unidirectional or bidirectional charging circuit that is in the form of a DC or AC charging circuit or that is in the form of a supply circuit for external consumers.

* * * * *